United States Patent
Ribeiro

(10) Patent No.: US 6,700,798 B2
(45) Date of Patent: *Mar. 2, 2004

(54) CIRCUIT BOARD MOUNTING STANDOFF AND METHOD OF USING SAME

(75) Inventor: Durval S. Ribeiro, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/347,802

(22) Filed: Jan. 22, 2003

(65) Prior Publication Data

US 2003/0132361 A1 Jul. 17, 2003

Related U.S. Application Data

(63) Continuation of application No. 09/750,471, filed on Dec. 28, 2000, now Pat. No. 6,545,878.

(51) Int. Cl.$^7$ .................................................. H05K 1/14
(52) U.S. Cl. .................... 361/804; 248/231.9; 411/510; 174/166 S
(58) Field of Search .................... D8/354, 363, 364; 174/138 D, 166 S; 24/453; 248/231.9; 361/784, 804; 411/508, 509, 510

(56) References Cited

U.S. PATENT DOCUMENTS

| 3,688,635 A | * | 9/1972 | Fegen ..................... 174/138 A |
| 3,733,655 A | * | 5/1973 | Kolibar ................... 403/408.1 |
| 3,836,703 A |   | 9/1974 | Coules ........................ 174/138 |
| 4,200,900 A | * | 4/1980 | McGeorge .................. 361/803 |
| 4,495,380 A |   | 1/1985 | Ryan et al. .................. 174/138 |
| D278,330 S |   | 4/1985 | Hill .............................. D13/24 |
| D291,055 S | * | 7/1987 | Fukuhara et al. ............ D8/354 |
| D291,278 S | * | 8/1987 | Hill .............................. D8/354 |
| 4,701,984 A | * | 10/1987 | Wyckoff .................... 24/581.1 |
| D292,871 S | * | 11/1987 | Hayashi ....................... D8/354 |
| 4,865,505 A |   | 9/1989 | Okada ........................ 411/512 |
| 4,875,140 A | * | 10/1989 | Delpech et al. ............. 361/789 |
| 4,901,204 A | * | 2/1990 | Hayashi ...................... 361/807 |
| 4,970,761 A | * | 11/1990 | Nakamura .................... 24/453 |
| 5,460,543 A | * | 10/1995 | Kosmala ..................... 439/567 |
| 5,738,476 A | * | 4/1998 | Assimakopoulos ......... 411/508 |
| 5,754,412 A |   | 5/1998 | Clavin ........................ 361/804 |
| 5,825,633 A | * | 10/1998 | Bujalski et al. ............. 361/804 |
| 6,038,140 A | * | 3/2000 | Petri .......................... 361/804 |
| D428,325 S | * | 7/2000 | van Dreumel et al. ....... D8/354 |
| 6,305,892 B1 | * | 10/2001 | Qiao ........................... 411/508 |

* cited by examiner

Primary Examiner—Ramon O. Ramirez
Assistant Examiner—Jon Szumny
(74) Attorney, Agent, or Firm—Baker & Hostetler LLP

(57) ABSTRACT

A connector for joining items such as electronic circuit boards in a spaced relation within a housing of an electronic device includes an elongated post, a plurality of wings, and a raised surface or a plurality of fingers. The wings are arranged around the post in a substantially symmetrical manner and have a length that is shorter than the length of the post. The raised surface or fingers are mounted near the tips of the post, between the wings and the ends of the post. The raised surface or fingers engage the circuit board and/or the housing when inserted into openings or receptacles in the circuit board and housing.

11 Claims, 3 Drawing Sheets

CIRCUIT BOARD MOUNTING STANDOFF AND METHOD OF USING SAME

This application is a continuation of Ser. No. 09/750,471, filed Dec. 28, 2000 is now U.S. Pat. No. 6,545,878.

CROSS-REFERENCE TO RELATED APPLICATIONS

This application claims priority to U.S. patent application entitled. CIRCUIT BOARD MOUNTING STANDOFF AND METHOD OF USING SAME, filed Dec. 28, 2000, having Ser. No. 09/750,471, the disclosure of which is hereby incorporated by reference.

FIELD OF THE INVENTION

The present invention relates to connectors for joining items such as electronic circuit boards in a spaced relation, as well as methods of using such connectors.

BACKGROUND OF THE INVENTION

Electronic devices, such as personal computers, portable computers, diagnostic equipment or analyzers, testing devices, electronic games, remote controls, pocket computers, palms, and other devices are typically manufactured so that the device housing includes one or more electronic circuit boards. Such circuit boards are typically attached to the housing by one or more fasteners, such as screws or pins, which hold the circuit board in place. When more than one circuit board is included in a device, the circuit boards must be separated from each other to avoid interference and/or damage of the circuit boards. Such separation may be achieved by, for example, fasteners attached to separate portions of the housing.

Because of the rapid pace of improvements to electronic devices to electronic circuitry, it is often desirable to replace and/or upgrade a circuit board within an existing electronic device. To accomplish such a replacement and/or upgrade, the undesired circuit board must be removed from the device. This requires an assembler to remove the screws, pins, or other fasteners which mount the circuit boards into the device and/or separate the circuit boards from each other. Such activity can be time consuming, and it requires precise attention to the removal of very small parts.

For example, U.S. Pat. No. 3,836,703, to Coules, discloses a spacer support for a circuit board having a resiliently flexible means for securing the support to a chassis. This support requires that a person apply pressure to a very small portion of the support to remove it from the housing. U.S. Pat. No. 4,495,380, to Ryan, discloses a similar standoff having similar disadvantages. Similarly, U.S. Pat. No. 5,754,412, to Clavin, discloses a standoff connector for fastening two items in a spaced relation, where the connector includes a body having a central opening for receiving a stud. The stud has a shaft for positioning the stud within the central opening and a handle for rotating the stud. Thus, the stud must carefully be rotated and removed from the body in order to remove a plate, such as a circuit board, from its desired location.

If a standoff were available that allowed for easy, rapid insertion of the standoff into a housing of an electronic device, as well as easy, rapid insertion of a circuit board onto the standoff, assembly time would be significantly reduced and cost savings would result.

Accordingly, an improved standoff for joining two items, such as electronic circuit boards, in a spaced relation is needed.

SUMMARY OF THE INVENTION

It is therefore an advantage of the present invention to provide an improved standoff for joining two items, such as electronic circuit boards, in a spaced relation.

The above other features and advantages are achieved through a novel component mounting standoff as herein disclosed. In accordance with one embodiment of the present invention, a standoff connector for fastening a planar surface in a spaced relation with another item includes an elongated post having a first end, a second end, an outer surface, and a length. Two or more ribs are integrally mounted on the post. The ribs are arranged in a substantially symmetrical manner around the outer surface of the post, and project away from the post. Each rib has a substantially equal length, and the length of each rib is shorter than the length of the post. The ribs are also arranged so that a first tip is formed on the post between the ribs and the first end of the post, while a second tip is formed between the ribs and the second end of the post. At least two raised fingers are integrally mounted on the first tip of the post. The raised fingers are arranged in a substantially symmetrical manner around the outer surface, and the fingers are positioned to provide a first post dimension approximately equal to a dimension of an opening in a planar surface. Preferably, the first post dimension and the dimension of the opening in the planar surface are the diameter of a circle.

Optionally and preferably, in accordance with this embodiment, the raised fingers are resilient, and the first post dimension is slightly larger than the dimension of the opening when the raised fingers are in a relaxed position. The raised fingers engage the planar surface when inserted into the opening of the planar surface. Optionally, the standoff connector also includes at least two additional raised fingers integrally mounted on the second tip of the post. The additional raised fingers are also resilient and are arranged in a substantially symmetrical manner around the outer surface of the post. The additional raised fingers are positioned to provide a second post dimension that is slightly larger than a dimension of a receptacle in a housing of an electronic device when the additional raised fingers are in a relaxed position. The additional raised fingers engage the receptacle when inserted into the receptacle. As an alternate option, the additional raised fingers may be positioned to provide a second post dimension that is slightly larger than a dimension of a second opening of a second planar surface when the additional fingers are in a relaxed position. The additional raised fingers thus engage the second planar surface when inserted into the opening.

As additional options, the first end and/or the second end of the post may be tapered, and the standoff connector may be comprised of a plastic material.

In accordance with an alternate embodiment of the present invention, a standoff for supporting a circuit board in a fixed spatial relationship with at least one item includes an elongated trunk having a first tip, a second tip, and an outside surface. The first tip is sized to fit within an opening of a circuit board. The second tip is sized to fit within an opening of another item. Two or more wings are integrally mounted on the trunk and extend outwardly from the trunk. The wings are positioned at approximately equal distances apart from each other around the outside surface of the trunk. The wings have a length that is shorter than the length of the trunk. The wings are positioned so that no wing extends along the entire first tip or second tip of the trunk. At least one raised surface is integrally mounted on the first tip of the trunk. The raised surface is sized to fit within the opening of the circuit board. Optionally, the standoff further includes at least one additional raised surface integrally mounted on the second tip of the trunk. The additional raised surface or surfaces are sized to fit within the opening of the item.

Optionally, in accordance with this embodiment, the raised surface mounted on the first tip engages the circuit board when inserted into the opening of the circuit board. Also optionally, the additional raised surface mounted on the second tip engages the item when inserted into the opening of the item. As additional options, the first end and/or the second end may be tapered, and the connector may be comprised of a plastic material.

In accordance with an additional embodiment of the present invention, a method of mounting a circuit board in a housing includes inserting, into a first housing portion, one tip of a standoff that has two tips. The housing portion has at least one first receptacle, and the first tip is placed into the first receptacle. The method also includes placing, onto one of the tips of the standoff, a circuit board having an opening. The opening has a dimension that corresponds to a dimension of the corresponding tip. Such a dimension may be, for example, a diameter of a circle. The placement of the standoff is such that the corresponding tip enters the opening of the circuit board. The method also includes mounting, on the other tip of the standoff, a second housing portion. The second housing portion has at least one second receptacle, and the placing of the standoff is positioned so that the other tip enters the second receptacle. In accordance with this method, the standoff has two or more wings integrally mounted on the standoff and positioned between the two tips. The wings extend outwardly from the standoff. Two or more first fingers are integrally mounted on one of the tips, and two or more second fingers are integrally mounted on the other tip. The first fingers engage the receptacle of the first housing portion, and the second fingers engage the receptacle of the second housing portion.

Optionally, the method also includes, before the insertion of the first tip into the first receptacle, placing an item onto the first housing portion. The item has an item opening, and the position of the item is such that the item opening corresponds to the first receptacle of the first housing portion. Thus, the tip of the standoff enters the first receptacle and the opening of the item, engaging both the receptacle and the item. Optionally, the step of placing the circuit board may be performed either before or after the inserting step.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract set forth below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

The present invention provides a novel component mounting standoff for an electronic device. Electronic devices, such as personal computers, portable computers, diagnostic equipment or analyzers, testing devices, electronic games, remote controls, pocket computers, palms, and other devices are typically manufactured so that the device includes one or more electronic circuit boards. Such boards, or other plates or planar surfaces within an electronic device, must be mounted into the device and separated from each other so that the boards, plates and planar surfaces do not move around within the device, as well as so that the items do not come in contact with each other. The present inventive mounting standoff is a device which may be used to easily and quickly install such items into a housing of an electronic device, as well as to separate such items from each other upon installation.

Figure 1:
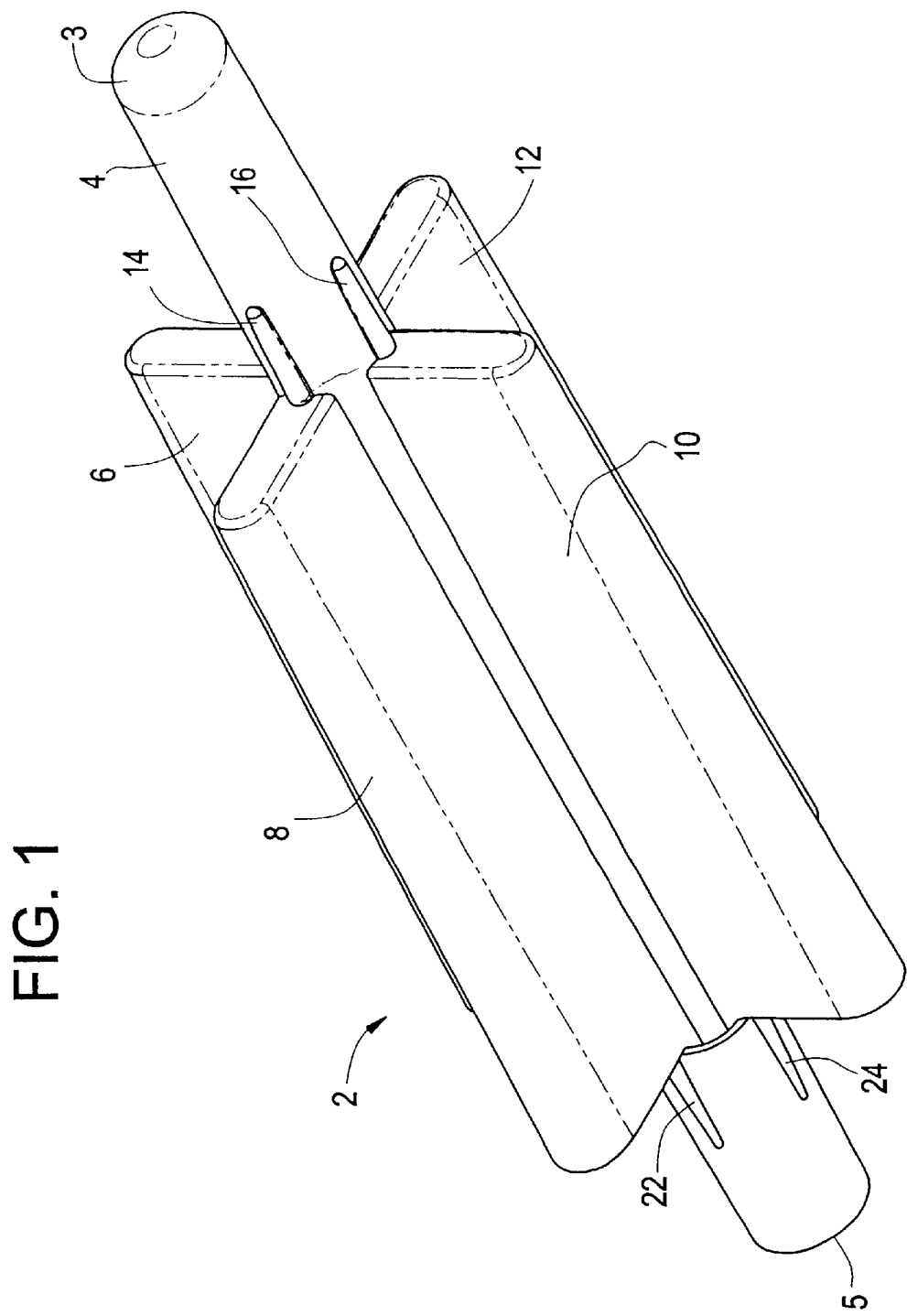
FIG. 1 is a perspective view of the features of various elements of a preferred embodiment of the present inventive component mounting standoff.

FIG. 1 provides a perspective view of the present inventive component mounting standoff. Referring to FIG. 1, an elongated trunk or post 4 has a first end 3 and a second end 5. The post has a dimension that corresponds to an opening in a circuit board or a receptacle in a housing so that the post 4 may be inserted into such an opening or housing receptacle. For example, the post 4 illustrated in FIG. 1 is circular, and thus it has a diameter. Optionally, the post or trunk 4 may be in the for m of a square, a triangle, or any other geometric shape that corresponds to the opening or receptacle within which the post will be inserted. Optionally, the first end 3 and/or the second end 5 of the post 4 may be tapered to facilitate such insertion.

The standoff connector 2 also includes at least two ribs or wings integrally mounted on the post. The exemplary embodiment illustrated in FIG. 1 illustrates four ribs identified as 6, 8, 10, and 12. However, any plurality of ribs may be mounted on the post 4. The ribs are mounted to project away from each-other and away from the post 4 in a symmetrical fashion, so that the ribs are spaced at approximately equal distances apart from each other. For example, FIG. 1 illustrates an embodiment having four ribs spaced apart in opposing directions to form an "X" shape around the post. Any additional number of ribs or wings that may fit around the post may be optionally used. The length of the each rib is shorter than the length of the post 4, and the position of the ribs on the post is such that no rib reaches either the first end 3 or the first end 5, thus creating two tips which may be inserted into an opening or receptacle.

At least two fingers such as 14 and 16, or 22 and 24, are integrally mounted on at least one tip of post 4, and preferably on both tips of the post 4. The fingers are also arranged around the outside surface of the post in a substantially symmetrical manner, and spaced at a substantially equal distance apart from each other. The fingers provide additional diameter to the post so that such a diameter approximately equals, or is slightly greater than, the diameter of the opening of a plate or circuit board, and/or the opening of a receptacle, depending on what will receive the post. Any equivalent element that provides this function may be used. For example, to provide additional diameter to the post, instead of fingers, a sleeve, one or more additional posts, or a raised post portion may be used. Optionally, the fingers or their equivalent may be tapered so that the fingers engage the opening or receptacle when the standoff 2 is inserted into the opening or receptacle. Preferably, the fingers are made of a resilient material, such as a plastic or hard rubber material, to facilitate engagement of the standoff with the device into which the standoff is inserted. Optionally, the entire standoff may be made of such a material.

Figure 2:
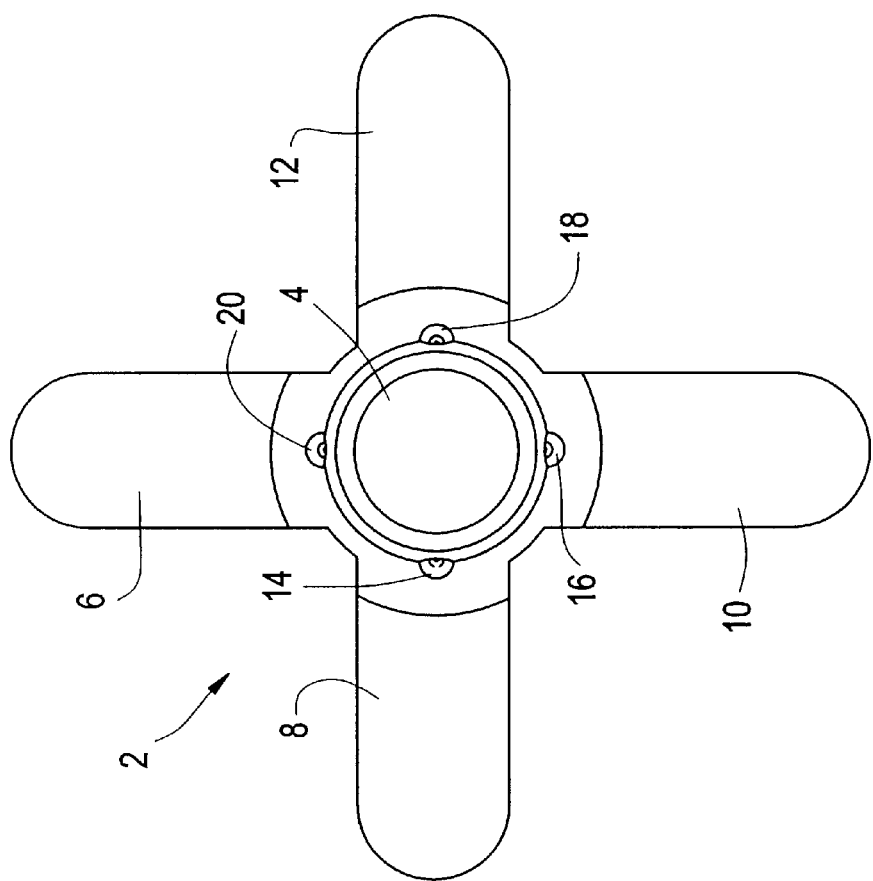
FIG. 2 provides a top-down view of various elements of a preferred embodiment of the present inventive component mounting standoff.

FIG. 2 illustrates a top down view of the post illustrated in FIG. 1. FIG. 2 more clearly illustrates the "X" pattern formed by the wings 6, 8, 10, and 12. Such a pattern, such a number of wings, and the number of fingers illustrated in FIG. 2 are all optional, as any number of wings or fingers, each forming any pattern, may be used.

Figure 3:
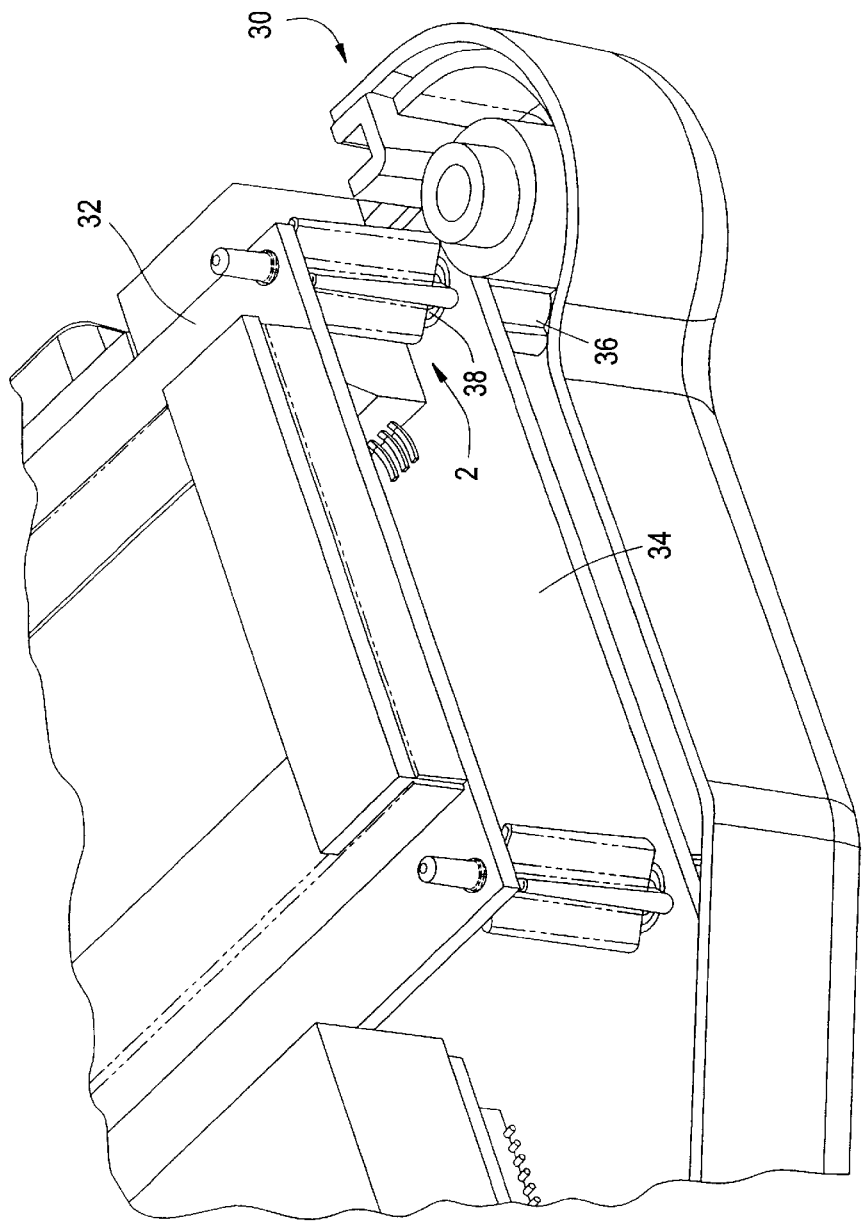
FIG. 3 provides a perspective view of a preferred embodiment of the present inventive mounting standoff in combination with an electronic device, illustrating the spatial relationships between multiple standoffs and two circuit boards separated by the standoffs.

FIG. 3 shows a combination of the present inventive standoff and an electronic device, illustrating how the standoff may be inserted into the electronic device to mount one or more circuit boards into the device. Referring to FIG. 3, a housing of an electronic device 30 has one or more receptacles or bosses 36. A circuit board such as 34 or other planar surface or plate is placed into the device 30. The circuit board has at least one opening 38, and the position of the opening 38 corresponds to the position of the receptacle 36. A mounting standoff 2 is placed into the receptacle 38 and the opening 36. The standoff 2 engages both the receptacle 36 and the opening 38 to hold the circuit board 34 in place. FIG. 3 illustrates an exemplary embodiment using two standoffs. Additional numbers of standoffs, or only a single standoff, may be used depending on the design of the device. FIG. 3 also illustrates the mounting of a second circuit board, planar surface, or plate 32 onto the standoff 2. The standoff 2 similarly engages circuit board or plate 32 to hold the circuit board or plate 32 into place. An additional portion of the housing 30 may be placed on top of circuit board 32, and such a housing may have one or more receptacles that correspond to the location of the opening on the electronic circuit board such that the standoff 2 engages such a receptacle.

What is claimed is:

1. A method for mounting a planar surface in a housing, comprising:

positioning a first tip of a standoff into a first receptacle of a first housing, the standoff comprising an elongated post having a first end, a second end, an outer surface, and a length, a plurality of ribs integrally mounted on the post, the ribs arranged in a substantially symmetrical manner around the outer surface and projecting away from the post, each rib having a substantially equal length, the length of each rib being shorter than the length of the post, the ribs so arranged on the post so that a first tip is formed between the ribs and the first end of the post and a second tip formed between the ribs and the second end of the post and at least two first tip raised fingers integrally mounted on the first tip of the post, the first tip raised fingers positioned to provide a first post dimension approximately equal to a diameter of the first receptacle; and positioning the second tip of the standoff through an opening of a planar surface, the second tip comprising at least two second tip raised fingers integrally mounted on the second tip of the post, the second tip fingers approximately equal to the opening in the planar surface.

2. The method as in claim 1, further comprising positioning the second tip of the standoff through a second receptacle in a second housing.

3. The method as in claim 1, wherein the planar surface is a circuit board.

4. The method as in claim 1, wherein the the at least first tip two fingers and the at least second tip two fingers are resilient.

5. A system for mounting a planar surface in a housing, comprising:

means for positioning a tip of a standoff into a first housing, the means for positioning comprising an elongated post having a first end, a second end, an outer surface, and a length, a plurality of ribs integrally mounted on the post, the ribs arranged in a substantially symmetrical manner around the outer surface and projecting away from the post, each rib having a substantially equal length, the length of each rib being shorter than the length of the post, the ribs so arranged on the post so that a first tip is formed between the ribs and the first end of the post and a second tip formed between the ribs and the second end of the post and at least two first tip raised fingers integrally mounted on the first tip of the post, the first tip raised fingers positioned to provide a first post dimension approximately equal to a diameter of the first receptacle; and means for positioning the second tip of the standoff through an opening of a planar surface, the standoff provides a raised surface that creates a first post dimension approximately equal to the opening in the planar surface.

6. The system as in claim 5, further comprising means for positioning the second tip of the standoff in a second housing.

7. The system as in claim 5, the planar surface is a circuit board.

8. The system as in claim 5, wherein the raised surface is a finger integrally mounted on the tip.

9. The system as in claim 5, wherein the means for positioning the second tip comprises at least two second tip raised fingers integrally mounted on the second tip of the second post, said at least two second tip raised fingers positioned to provide a first post dimension approximately equal to a diameter of the opening in the planar surface.

10. The system as in claim 5, wherein the at least two first raised fingers have varying diameters at either ends.

11. The system as in claim 10, wherein the varying diameter is comprised of a larger diameter at a base of the at least two first raised fingers, wherein the base is substantially near the ribs.

* * * * *